US007089135B2

(12) United States Patent
Rajsuman et al.

(10) Patent No.: US 7,089,135 B2
(45) Date of Patent: Aug. 8, 2006

(54) EVENT BASED IC TEST SYSTEM

(75) Inventors: Rochit Rajsuman, Santa Clara, CA (US); Shigeru Sugamori, Santa Clara, CA (US); Robert F. Sauer, Santa Clara, CA (US); Hiroaki Yamoto, Santa Clara, CA (US); James Alan Turnquist, Santa Clara, CA (US); Bruce R. Parnas, Santa Clara, CA (US); Anthony Le, Santa Clara, CA (US)

(73) Assignee: Advantest Corp., Tokyo (JP)

( * ) Notice: Subject to any disclaimer, the term of this patent is extended or adjusted under 35 U.S.C. 154(b) by 812 days.

(21) Appl. No.: 10/150,777

(22) Filed: May 20, 2002

(65) Prior Publication Data
US 2003/0217345 A1 Nov. 20, 2003

(51) Int. Cl.
*G01R 31/00* (2006.01)
(52) U.S. Cl. .................. 702/117; 702/124; 714/741
(58) Field of Classification Search .............. 702/117, 702/124; 714/741
See application file for complete search history.

(56) References Cited

U.S. PATENT DOCUMENTS

| 4,855,670 | A | * | 8/1989 | Green ....................... 324/73.1 |
| 5,212,443 | A | | 5/1993 | West et al. |
| 5,225,772 | A | | 7/1993 | Cheung et al. |
| 5,592,659 | A | | 1/1997 | Toyama et al. |
| 5,825,785 | A | * | 10/1998 | Barry et al. ................. 714/732 |
| 5,835,506 | A | | 11/1998 | Kuglin |
| 6,061,283 | A | * | 5/2000 | Takahashi et al. .......... 365/201 |
| 6,092,225 | A | | 7/2000 | Gruodis et al. |
| 6,212,493 | B1 | * | 4/2001 | Huggins et al. ............... 703/22 |
| 6,295,623 | B1 | * | 9/2001 | Lesmeister et al. ......... 714/741 |
| 6,331,770 | B1 | * | 12/2001 | Sugamori ................ 324/158.1 |
| 6,360,343 | B1 | * | 3/2002 | Turnquist ................... 714/731 |
| 6,363,509 | B1 | * | 3/2002 | Parulkar et al. ............ 714/738 |
| 6,385,750 | B1 | * | 5/2002 | Kapur et al. ................ 714/738 |
| 6,496,953 | B1 | * | 12/2002 | Helland ...................... 714/744 |
| 6,557,133 | B1 | * | 4/2003 | Gomes ........................ 714/738 |
| 6,594,609 | B1 | * | 7/2003 | Le et al. ..................... 702/117 |

* cited by examiner

*Primary Examiner*—Marc S. Hoff
*Assistant Examiner*—Janet Robbins
(74) *Attorney, Agent, or Firm*—Muramatsu & Associates

(57) ABSTRACT

An event based test system for testing an IC device under test (DUT) designed under an automatic electronic design (EDA) environment. The event based test system includes an event memory for storing event data derived directly from simulation of design data for an intended IC in the EDA environment where the event data to denote each event is formed with time index indicating a time length from a predetermined point and an event type indicating a type of change at an event, an event generation unit for generating test vectors based on the event data where waveform of each vector is determined by the event type and a timing of the waveform is determined by accumulating the time index of previous events, and means for supplying test vectors to the DUT and evaluating response outputs of the DUT at predetermined timings.

17 Claims, 11 Drawing Sheets

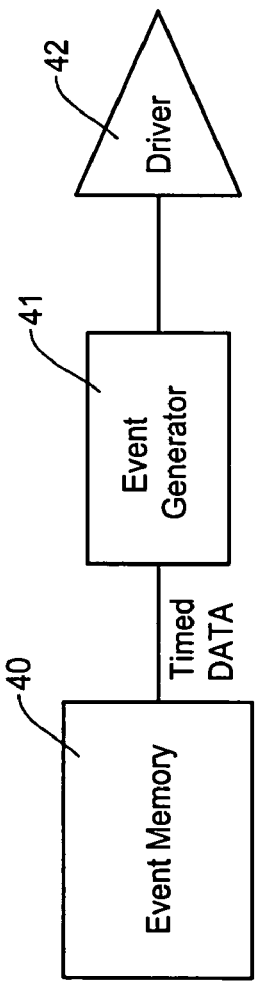
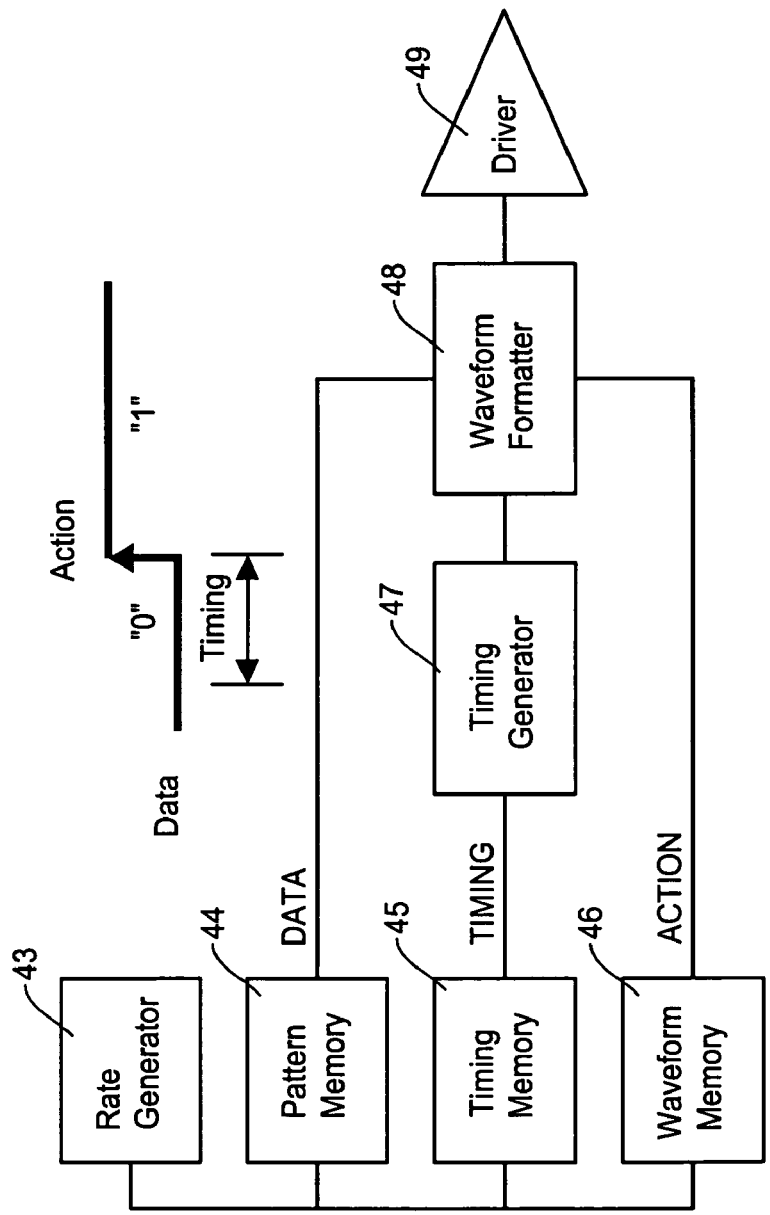
Fig. 3A
Fig. 3B (Prior Art)

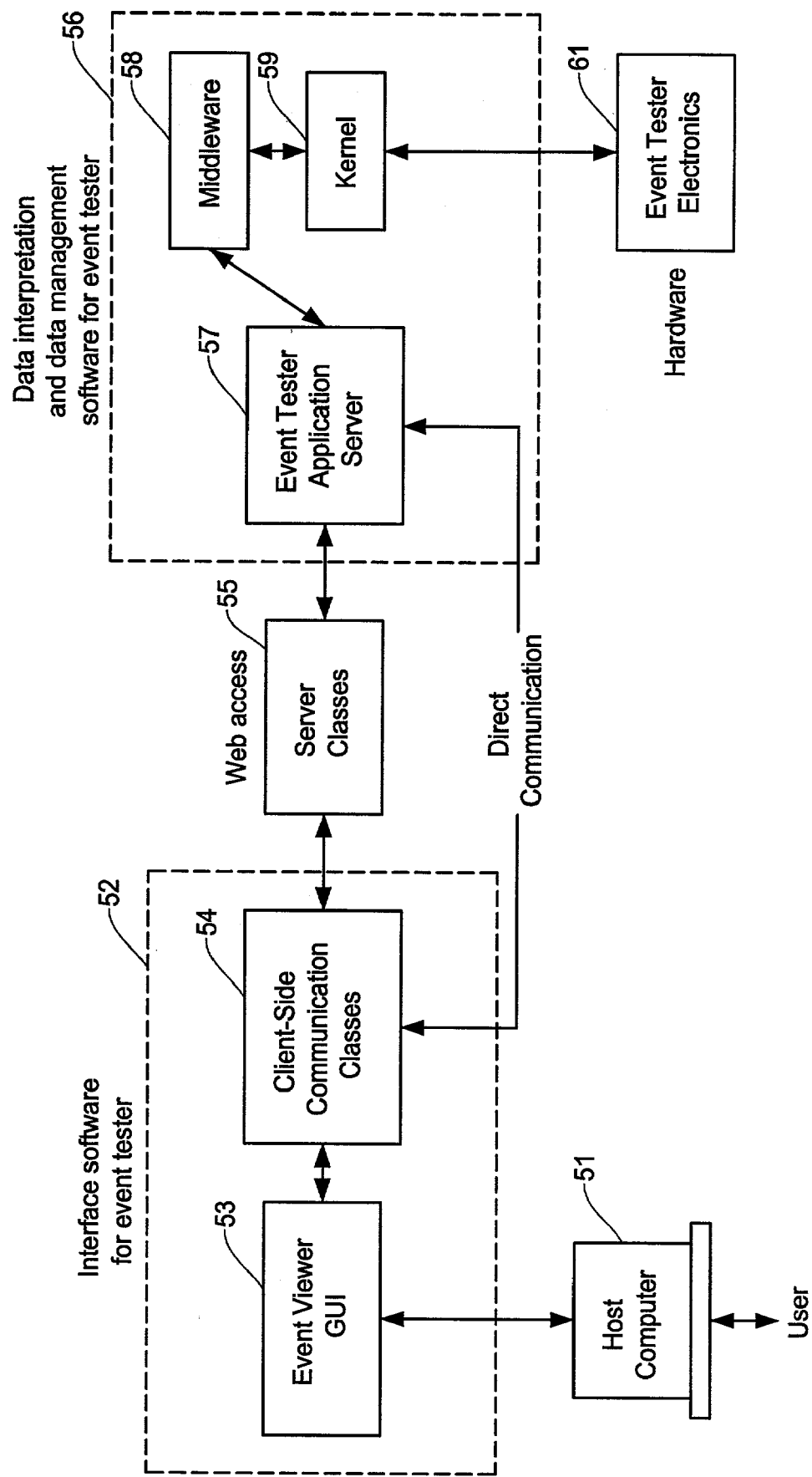

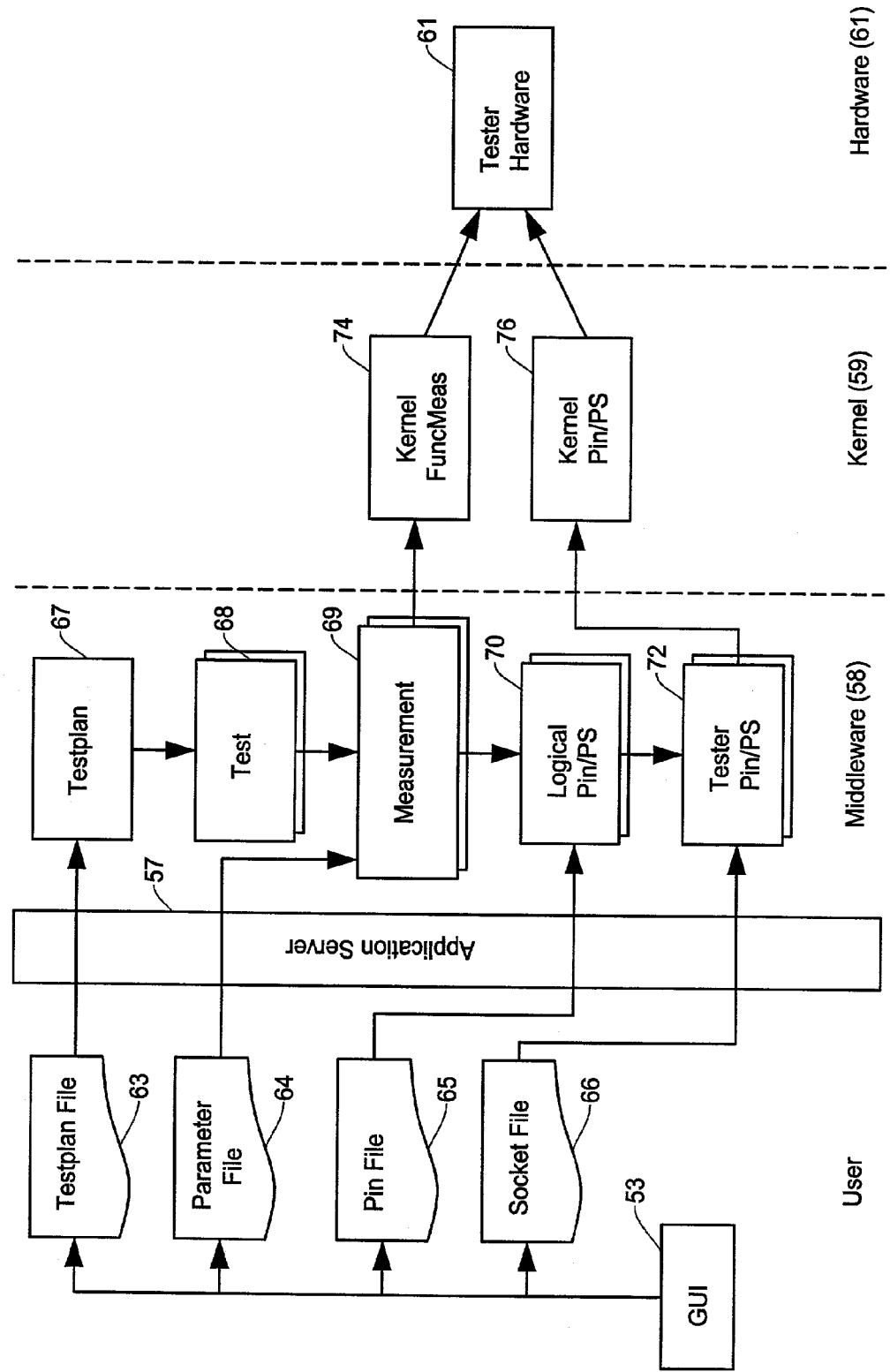

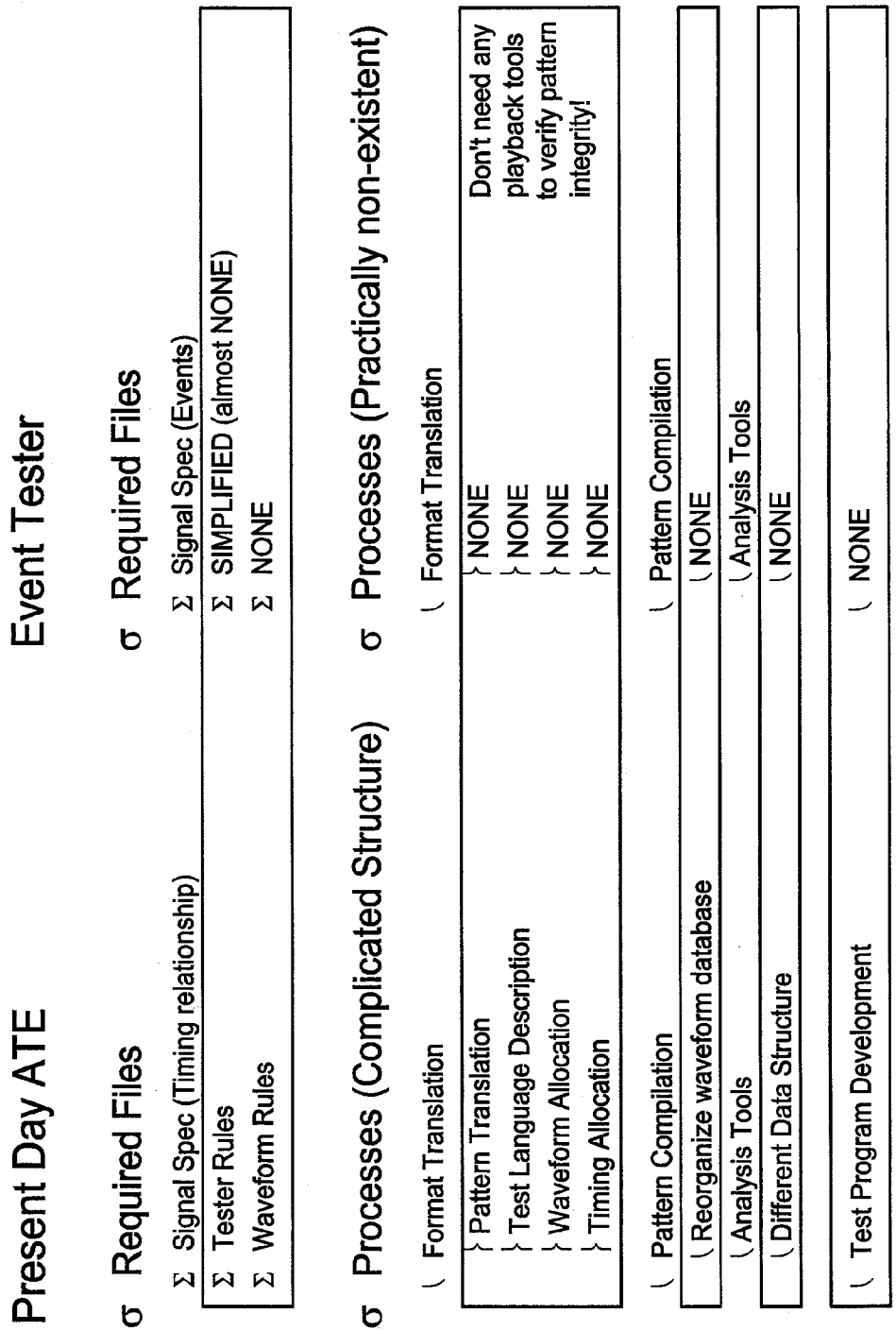

EVENT BASED IC TEST SYSTEM

FIELD OF THE INVENTION

This invention relates to a design and architecture of a new type of semiconductor IC test system, and more particularly, to an event based IC test system in which test data is utilized in an event form thereby enabling a direct use of design simulation data produced in an electronic design automation (EDA) environment.

BACKGROUND OF THE INVENTION

In testing semiconductor IC devices by a semiconductor IC test system (IC tester or tester), the basic procedure of functional testing of a semiconductor IC device contains creation of input (drive) stimulus for the IC device, application of these stimulus and comparison of the output of the IC device with expected results by strobing the outputs at predetermined times. Such input stimulus and strobes are collectively called a test pattern or test vector and are traditionally generated based on test data in a cyclized form. Such a traditional test system is sometimes called a cycle based test system or a cyclized tester where various data for producing the input stimulus and strobes is defined relative to corresponding test cycles (tester rates or timesets).

Today, IC design is made under an electronic design automation (EDA) environment where IC designers develop new ICs with use of a high-level language such as Verilog or VHDL and simulate the design by behavioral, gate-level Verilog/VHDL simulators. Such design simulation is targeted to check the functionality and performance before the design is fabricated into silicon IC. To use the design simulation data, the traditional IC test systems require conversion of design simulation data into cyclized form, such as WGL (Waveform Generation Language) or STIL (Standard Test Interface Language) format.

As noted above, the present day semiconductor IC test systems are single or multiple timesets (cyclized or cycle based) machines, in which data are associated with each pin (T. Kazamaki et al. "Trial model of 100 MHz test station for high speed LSI test system", IEEE Int. Test Conf., pp. 139–145, 1978, T. Sudo, "A 100 MHz tester—challenge to new horizon of testing high speed LSI " IEEE Int. Test Conf., pp. 362–368, 1979, and M. Shimizu et al., "100 MHz algorithmic pattern generator for memory testing", IEEE, Int. Test Conf., pp. 56–67, 1980). The variations are that in some test systems, these timesets can be switched on the fly; in other test systems, waveform formatters are available to generate complex waveforms; and third variation is that relay functionalities are incorporated for shared resource machines in order to share or distribute the timing generators to the desired pins (S. Bisset, "The development of a tester per pin VLSI test system architecture", IEEE Int. Test Conf., pp. 151–155, 1983).

Because of these timesets and waveform formatters, the operating environment of today's test systems is quite different from the IC design environment. Timesets, waveforms, waveform groups, timing generators, waveform formatters, sequences and pattern bits/pin are manifestations of the test systems and not the IC design. However, because of these limitations in today's test systems, IC testing requires a different environment than the original IC design and simulation environment.

From the user's point of view, the above limitations cause following problems: (i) vector conversion consumes extensive time, server and disk capacities, and is very error-prone, (ii) cyclization of vectors makes multiple clock domain devices untestable, and (iii) due to a finite number of resources such as timesets, waveform groups, timing generators, etc., there arises tester limitations.

While the primary IC design and simulation environment is event oriented, because of the above limitations, the test environment is cyclized. Hence, it is a foreign environment from the original IC design environment and causes difficulties during testing and debug the ICs. Also, to get to the test environment, engineers are required to reformat simulation testbenches and re-run simulation to capture the cyclized vectors that are required for testing. Essentially, it makes the test data very different than the original design and simulation data. The engineers translate vectors into another intermediate format such as STIL (Standard Test Interface Language, IEEE standard 1450, 1999) and WGL (Waveform Generation Language) to create test program as illustrated in FIG. 1A.

FIG. 1A shows a process involved in today's cyclized test systems for testing the IC by using the design testbench data (simulation vectors). In this example, the left side indicates a design domain 10 where the design testbench is executed through a logic simulator thereby producing input/output event data of the design, i.e. VCD (Value Change Dump by Verilog). The right side indicates a test domain 20 where the designed IC device is tested by the IC tester with use of the test vectors produced based on the VCD data produced in the design domain.

As shown in FIG. 1A, in the conventional technology involving the cycle based test system, the test program development requires (i) extracting event based simulation vectors (VCD format) at step 11, (ii) converting the simulation vectors into cycle based vectors at step 12, and (iii) converting the cycle based vectors into tester's format such as WGL and STIL at step 21 and/or a proprietary format such as TDL ("Test Description Language" by Advantest Corporation, Tokyo, Japan) at step 22. The resultant test vectors in the cycle format are used to create a test program at step 23. This test program is executed on the tester to evaluate the response outputs of IC.

Converting the IC simulation vectors from the VCD format to the cyclized format is very time consuming, complex and error-prone. This problem is further compounded by the fact that every tester has it's own unique and proprietary language and vector format (ex. TDL and LPAT by Advantest). Subsequently, all this effort in vector conversion becomes extremely time consuming and costly. The time required to process these vectors has grown proportionately with the size of the vectors, taking as much as a month to process all VCD files into cyclized format.

This lengthy process also impedes the ability to process new or improved vectors quickly, thereby slowing the test and debug process. Moreover, the very act of converting original IC simulation vectors into a tester's cyclized format endangers the accuracy of data. This results in errors and test vectors that are no longer simulation-faithful. All these problems result in additional time and cost.

Therefore, there is an urgent need in the industry for a semiconductor IC test system that operates in the IC design environment and eliminates all the complexity involved in the test data conversion into cyclized form as it is done by today's test systems.

SUMMARY OF THE INVENTION

It is, therefore, an object of the present invention to provide a new type of semiconductor IC test system which is capable of direct use of design simulation data produced in an electronic design automation (EDA) environment.

It is another object of the present invention to provide a new tester architecture that allows IC design environment to extend from simulation to the physical testing of the designed integrated circuits (ICs).

It is a further object of the present invention to provide a new tester architecture that allows testing in design simulation environment, which saves engineering time and reduces cost of testing semiconductor ICs.

It is a further object of the present invention to provide a new tester architecture that eliminates vector processing steps in the conventional technology and greatly simplifies file requirements and pattern compilation process, thereby saving time, cost and avoiding errors in the vector conversion.

One aspect of the present invention, is a method for testing an IC device under test (DUT) designed under an automatic electronic design (EDA) environment. The method includes the steps of storing event data derived directly from device simulation of design data for an intended IC in the EDA environment in an event memory where the event data for each event is formed with event timing data indicating a time of the event and event type data indicating a type of event, generating test vectors based on the event data from the event memory where waveform of each vector is determined by the event type data, and the timing of event is determined by accumulating the timing data of previous events, and supplying the test vectors to the DUT and evaluating response outputs of the DUT at predetermined timings.

Another aspect of the present invention is an event based test system for testing the DUT designed under the EDA environment. The event based test system includes an event memory for storing event data derived directly from logic simulation of design data for an intended IC in the EDA environment wherein the event data is formed with time index indicating a time length from a predetermined point and an event type indicating a type of event, an event generation unit for generating test vectors based on the event data from the event memory where waveform of each vector is determined by the event type and a timing of the waveform is determined by accumulating the time index of previous events, and means for supplying the test vectors to the DUT and evaluating response outputs of the DUT at predetermined timings.

A further aspect of the present invention is an event based test system for testing the DUT designed under the EDA environment. The test system includes a host computer for controlling an overall operation of the test system, interface software for interfacing the host computer and the event based test system where the interface software includes graphic user interface (GUI) establishing an event viewer for monitoring and editing events for the test system, data interpretation and management software for interpreting and managing data from the host computer through the interface software, and event tester hardware having a plurality of event tester units for storing event data derived directly from logic simulation of design data and generating test vectors based on the event data and supplying the test vectors to the DUT and evaluating response outputs of the DUT at predetermined timings.

According to the present invention, the method and architecture of the test system allows testing and debug of ICs without diverting from the environment in which the IC was designed. As noted above, the traditional IC test systems require conversion of the design simulation data into a cyclized form, such as the WGL or STIL format. The new architecture avoids such conversion and uses design simulation data as-is. Thus, the method and apparatus of the present invention allow testing in the environment identical to the design simulation environment, which saves engineering time and reduces cost of testing semiconductor ICs.

BRIEF DESCRIPTION OF THE DRAWINGS

FIG. 3A is a schematic block diagram showing a new tester architecture in accordance with the present invention, FIG. 3B is a schematic diagram showing a conventional tester architecture.

FIG. 4 is a schematic diagram showing an example of overall system architecture of the event based test system of the present invention.

FIG. 6A is a diagram showing a file structure and data flow from GUI to event tester hardware.

FIG. 9 is a diagram showing a list of comparison between the conventional IC test systems with the event based test system of the present invention.

DETAILED DESCRIPTION OF THE INVENTION

The present invention is now described in more detail with reference to the accompanying drawings. The problems mentioned above require a complete change in the environment and process as well as the architecture of the test system in use today. The solution needs a fundamental change that simplifies the testing and test system rather than adding yet more complexity to the already complicated process. For example, in principle, sophisticated software can be developed that ensures the correct vector translation from VCD to STIL. However, the basic problem of time, effort and cost due to the translation process still remains intact. Hence, the problem should be solved not by developing more sophisticated software, but by eliminating the need for vector translation itself.

In other words, the IC testing environment should be the same as the original IC design environment; engineers should not be required to change their simulation testbenches into ATE cyclized format, and VCD vectors need not be converted into STIL or other formats. The engineers should develop only one simulation testbench that should be used without any changes for both IC design simulation as well as IC testing. It means that there should be no cyclization of testbenches, no vector conversion from VCD to other formats and subsequently no need to develop complicated specialized test programs.

Figure 1B:
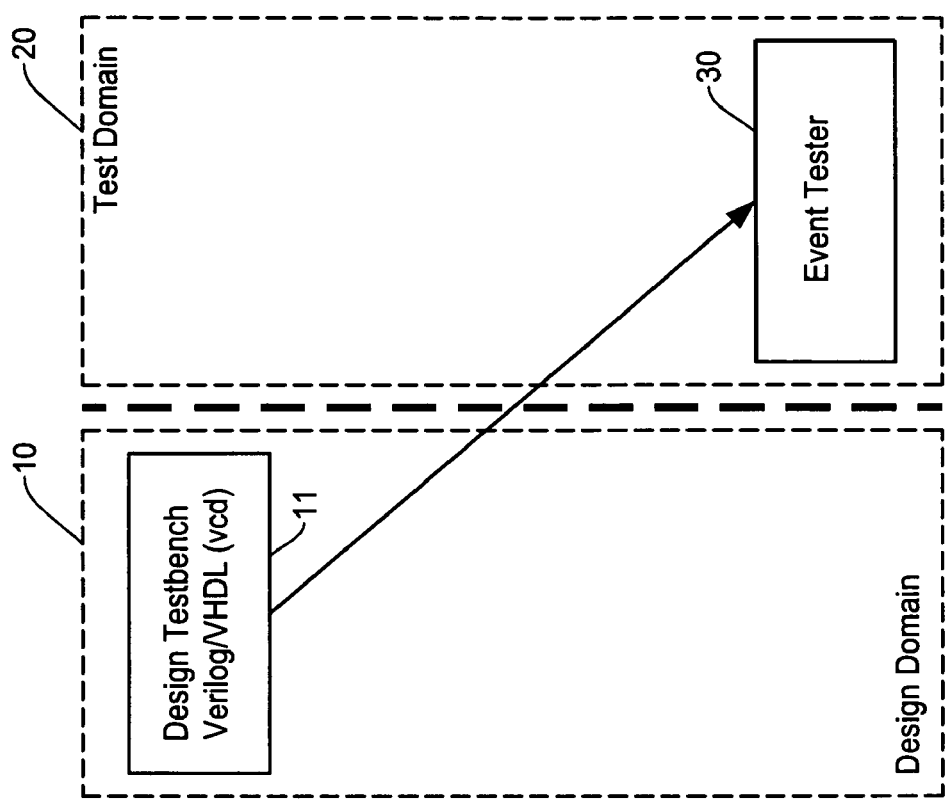
FIG. 1B is a flow diagram showing the new process of testing obtained through the present invention.
Figure 1A:
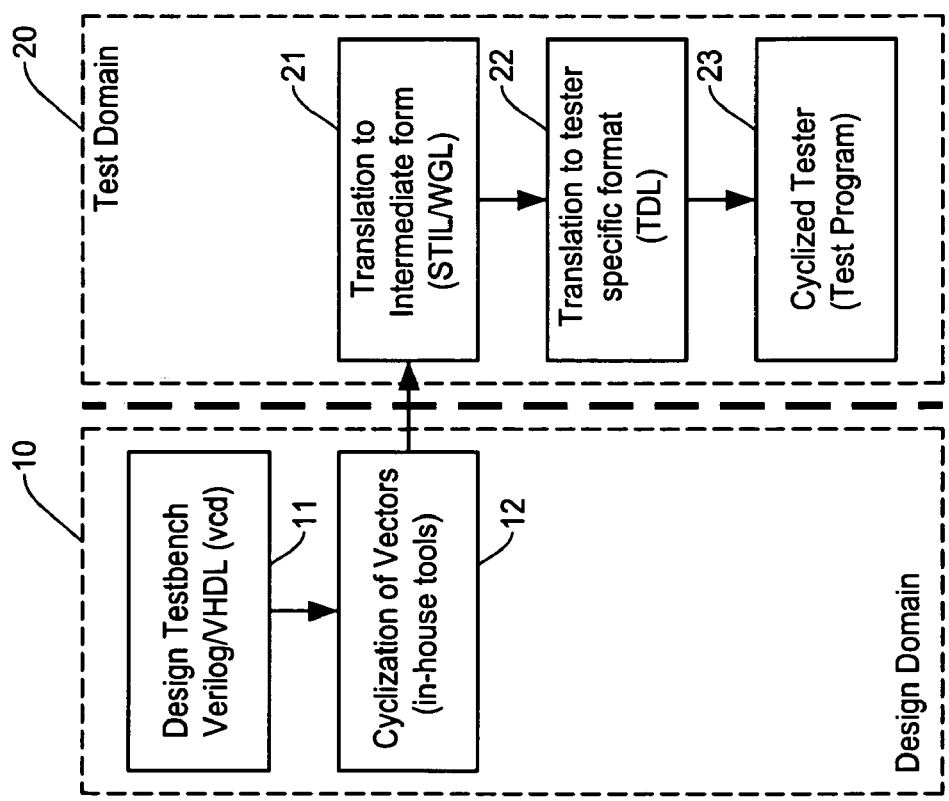
FIG. 1A is a flow diagram showing a process of test program development for conventional IC test systems.

This concept is illustrated in FIG. 1B. The design testbench data 11, i.e. VCD, produced in the design domain 10 can be directly used by an event based IC tester 30 in the test domain 20. This is a stark difference from the traditional process of FIG. 1A where the test program development requires conversion of event based simulation vectors into cycle based vectors, capturing them into the VCD format, and converting them into tester's format.

Figure 2:
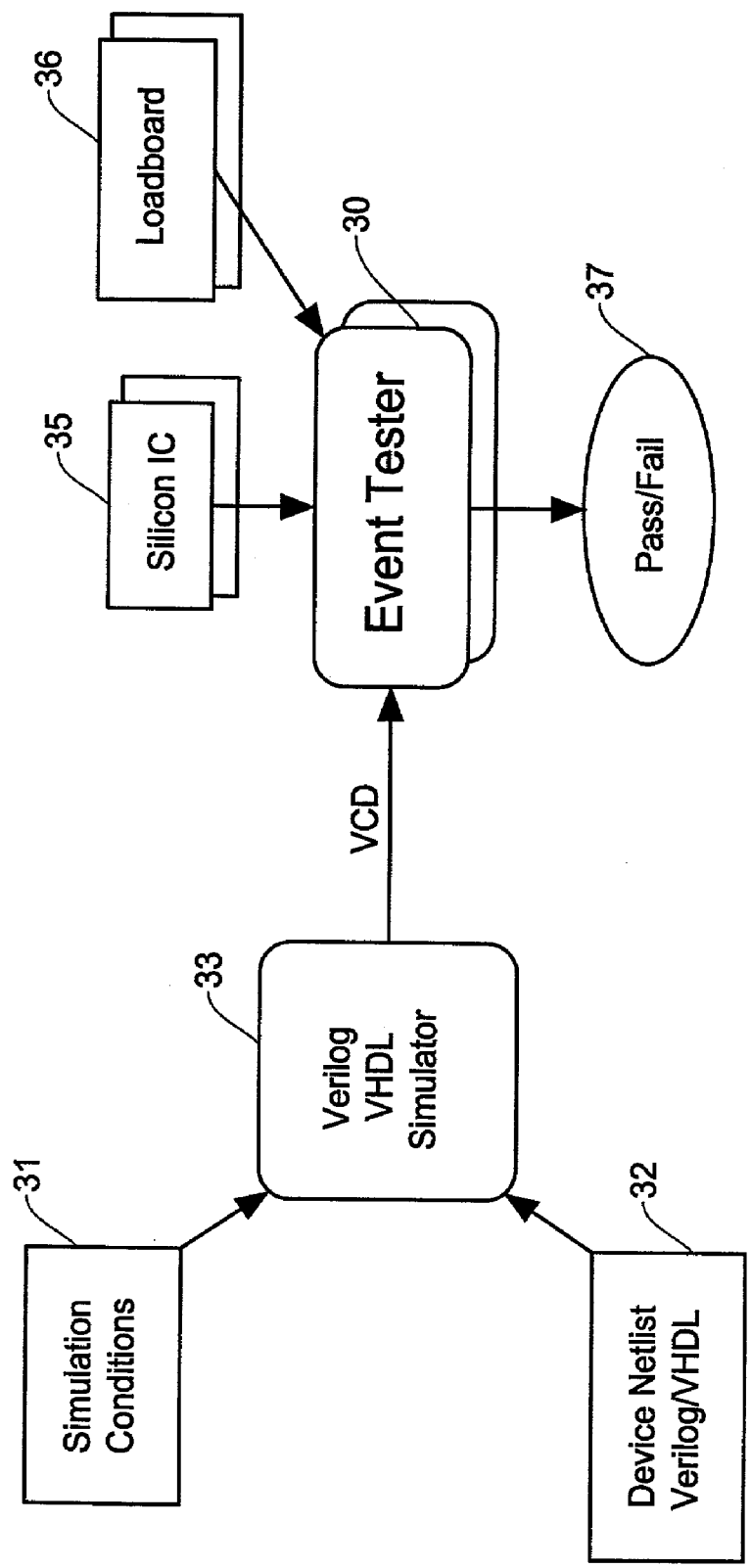
FIG. 2 is a schematic diagram showing an IC testing process using the event based test system of the present invention.

The overall IC testing process, using the concept of the present invention is illustrated in FIG. 2. The objective is to save time, effort and money by eliminating those steps in the conventional technology rather than developing yet another means to do these tasks. In the example of FIG. 2, the designers produce design data, typically behavioral or RTL level data describing the function of the circuits in the intended IC. Such design data is converted to device netlist 32 indicating sets of components connected by signals. Based on simulation conditions 31 and the device netlist 32, the designer runs a simulator 33, such as a Verilog/VHDL simulator, with use of testbenches produced when designing the IC to simulate the functions of the IC. The results of this simulation are input and output value sets, i.e, Verilog VCD, which is in an event format.

A silicon IC 35 is produced based on the device netlist 32 which may be mounted on a loadboard 36 of an event tester (event based test system) 30. The event tester 30 produces test vectors by directly using the VCD produced by the simulator 33 and applies the test vectors to the silicon IC 35 and evaluates response outputs therefrom. Accordingly, the test result is obtained and stored in a pass/fail file 37 for failure analysis. In this manner, the event based test system of the present invention is able to directly utilize the design data to produce the test vectors.

The assignee of this invention has disclosed a concept of an event based test system in previous patent applications such as U.S. application Ser. No. 09/406,300 (now U.S. Pat. No. 6,532,561) and Ser. No. 09/340,371 (now U.S. Pat. No. 6,678,643). It should be noted that these prior applications are not prior art against the present invention. This application further discloses an overall architecture of event based test system, including its hardware and software components, input-output formats, internal-external data flow and specific design that fulfill these objectives.

The new tester architecture is oriented towards IC design and simulation environment. In this architecture, the tester uses changes in the signal values (events) identical to the events as observed in the IC simulation. Secondly, events on each pin are treated independently rather than cyclizing them according to time-sets. Thus, the present invention eliminates the vector conversions and need to develop test programs.

Figure 3C:
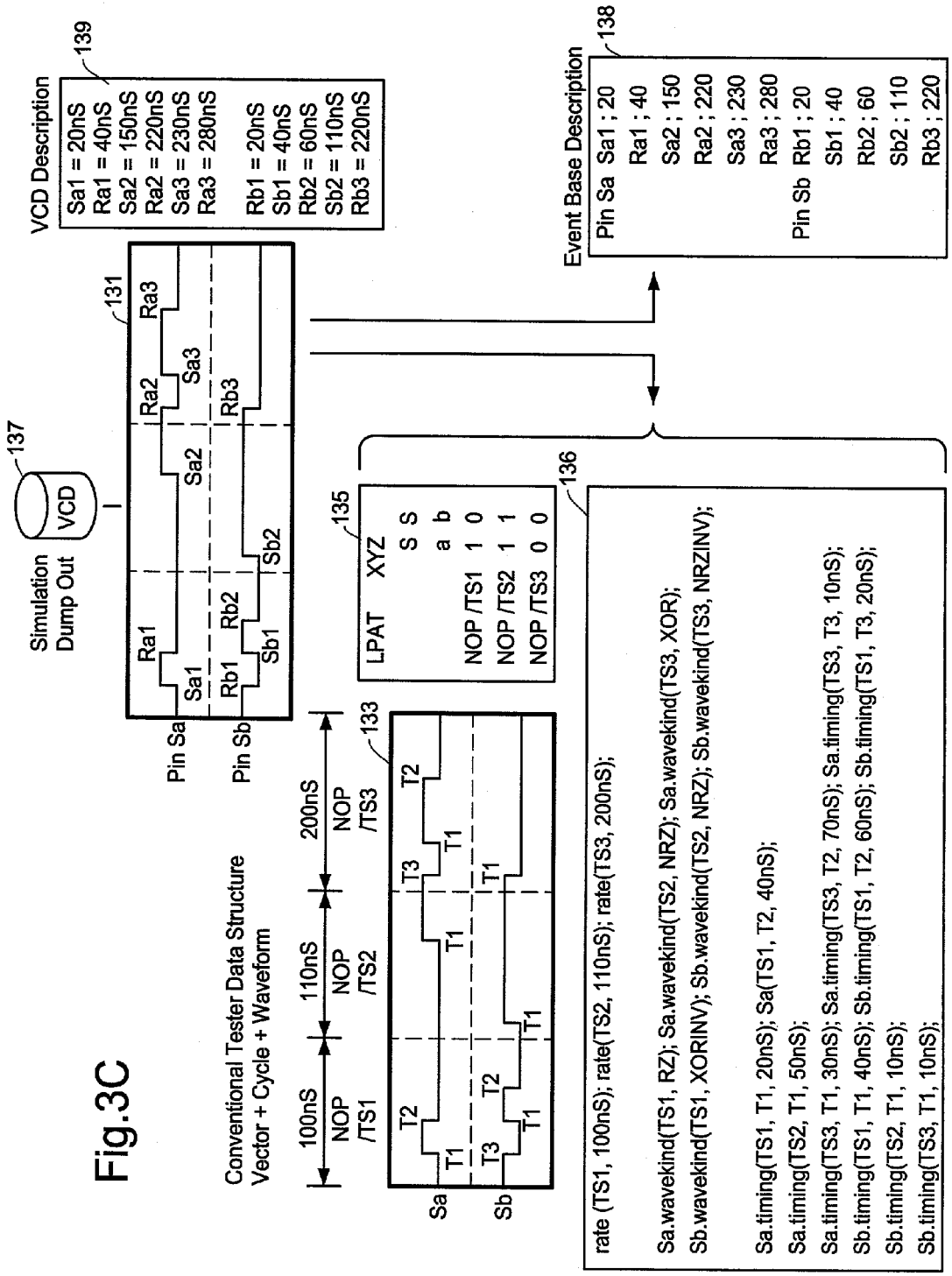
FIG. 3C is a diagram for comparing an example of descriptions in the cycle format and in the event format for the same test vectors.

The basic architecture of the event based test system is shown in FIG. 3A. For comparison purposes, the architecture of conventional test system (cycle based system) is shown in FIG. 3B. Further, FIG. 3C illustrates a specific example of descriptions of the test vector in the cycle format and the event format for clearly showing the different between the two.

In FIG. 3A, the event based test system is configured by an event memory 40 for storing event data (timed data), an event generator 41 for generating events based on the event data, and a driver 42 for supplying the test vectors to the device under test (DUT). In FIG. 3B, the conventional cycle based test system is configured by a rate generator 43 for producing tester rates (test cycles), a pattern memory for storing pattern data, a timing memory 45 for storing timing data, a waveform memory for storing waveform (action) data, a timing generator 47 for producing timing signals based on the timing data, a waveform formatter 48 for producing a test pattern based on the timing signals, pattern data and waveform data, and a driver 49 for supplying test vectors to the DUT.

As clear from FIGS. 3A and 3B, the rate generator 43, timing generator 47, pattern memory 44, waveform memory 46 and timing memory 45 of the conventional test systems are eliminated, and instead, the event memory 40 and event generator units 41 are used as illustrated in FIG. 3A. This is a complete change in the tester architecture. The event memory 40 contains the events as observed in the Verilog/VHDL simulation. The event generator 41 converts these events into actions (waveforms of test vectors) by using the associated timing as recorded in the Verilog/VHDL simulation. Through the driver 42, these actions are applied to the DUT and response of the DUT is compared against the IC simulation values to detect a fault.

By eliminating the rate and timing generators, pattern memory, waveform memory and timing memory, the architecture effectively eliminates the need of cyclizing the vectors and translation into other formats such as WGL or STIL. The event memory 40 in FIG. 3A stores events as they were recorded in the IC simulation. Thus, each test vector (action) will be created by driving an event (data "0" or "1") with its timing. In the cycle based test system of FIG. 3B, each test vector will be created by driving a specified waveform (action) based on a pattern data ("0" or "1") at a timing specified by a timeset (test cycle). Thus, this new architecture accomplishes the objective that cyclization and vector translation process should be eliminated from the testing; and that the test environment should be the same as the IC design environment.

To explain the difference between the cycle format and event format more clearly, brief comparison is made between the two formats in describing the same test vector in FIG. 3C with waveform 131. The design simulation VCD of the waveform 131 is stored in a file 137. The description in this file 137 is shown in VCD description 139 which is event based format showing the changes in the input and output of the designed IC. The waveforms 131 illustrate two pins Sa and Sb. The event data describing the waveforms is formed of set and reset edges San, Sbn, Ran and Rbn, and their timings (for example, time lengths from a previous event or a specified reference point).

For producing the waveform 131 in the conventional semiconductor test system based on the cycle based concept, the test data must be divided into test cycles (tester rate), waveforms (types of waveforms, and their edge timings), and pattern values. An example of such descriptions is shown in the center and left of FIG. 3C. In the cycle based description, test pattern data 135 and time sets 133 are shown in the left part of FIG. 3C, a test pattern is divided into each test cycle (TS1, TS2 and TS3) to define the waveforms and timings (delay times) for each test cycle.

An example of data descriptions for such waveforms, timings and test cycles is shown in timing data 136. An example of logic "1", "0" or "Z" of the waveforms is shown in pattern data 135. For example, in the timing data 136, the test cycle is described by "rate" to define time intervals between test cycles, and the waveform is described by RZ (return to zero), NRZ (non-return to zero) and XOR (exclusive OR). Further, the timing of each waveform is defined by a delay time from a predetermined edge (ex. start edge) of the corresponding test cycle.

As seen in FIG. 3C, the event base description 138 is identical to the design simulation results (VCD) while the cycle base description requires the time-sets and various types of descriptions which are too remote from the original design simulation result. It should be noted that FIGS. 3A is a very simplified diagram to illustrate the basic concept. However, the architecture shown in FIG. 3A is neither obvious nor simple to achieve. Here, various design aspects to achieve this architecture will be described.

An example of overall tester design is shown in FIG. 4. In the example of FIG. 4, the overall tester design includes a host computer 51, interface software 52, data interpretation and management software 56 and event tester hardware 61. The host computer 51 and the event tester hardware 61 can be remotely located from one another and communicated directly or through a public communication network such as through a Web server 55 or a dedicated communication network. The interface software 52 includes an event viewer GUI (Graphical User Interface) 53 and a user-side communication classes 54. Through the host computer 51, a user accesses the event viewer GUI 53 and the event tester. The software of the event viewer GUI 53 allows to specify various commands and necessary files as well as allows data editing and manipulation during testing.

The data interpretation and management software 56 primarily contains three components: (i) a middleware 58 for data processing and interpretation, (ii) a kernel 59 for mediating between hardware and software, and (iii) an event tester application server 57 for coordinating the communication from the user (via GUI 53) to the middleware 58 or vice versa. As noted above, the communication from GUI 53 to the application server 57 can take place either by direct link or through the communication network such as the Web access.

The middleware 58 includes various software components for data processing and interpretation and produce various types of data as will be described with reference to FIG. 6A. The kernel 59 mediates between the hardware and software by, for example, interpreting the voltage/current values obtained by the tester hardware in logic 0, 1, or Z values and supplies these values to the middleware 58. Similarly, the kernel 59 converts values from the middleware 58 into physical voltage/current levels for the tester hardware.

As illustrated in FIG. 4, various components of software have been developed that act in concert to provide the necessary functionality through a custom ASIC and a printed circuit board. In the following, a structure and an operation of each of the various components will be described in more detail. Further, the system operation will also be described with reference to the drawings.

As mentioned earlier, the event tester of the present invention uses VCD data without cyclization. As noted above, VCD is basically a timed-value format to describes change in signal value and the time of change. It specifies a time, signal name and binary value of a signal to identify an event (for example, transition from 0-to-1 or 1-to-0). For example, it can specify that at time 120 ns, signal identified by ASCII character $ becomes 0 (in other words, signal with name "$" changes from 1-to-0 at 120 ns; event 0 occurs on "$" at 120 ns) as noted in the left of FIG. 5A (VCD file 60).

The middleware 58 which is the software component in FIG. 4, interprets this data and provides it in a form of time index and binary (or hexadecimal) value to the kernel 59 for the tester hardware 61. Alternatively, in reverse order, the middleware 58 obtains time index and binary value from the tester hardware 61 via the kernel 59 and provide it in the user's understandable form via the event viewer GUI 53 and the host computer 51.

Figure 5A:
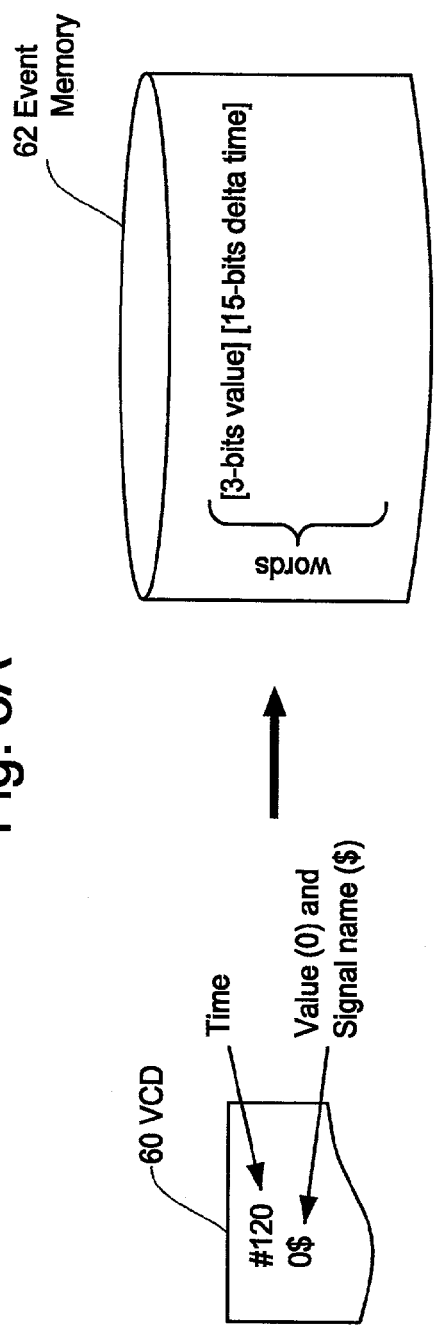
FIGS. 5A and 5B are schematic diagrams showing a basic concept of the present invention how the event data produced in the design environment is interpreted for use by the event tester hardware.

A unique aspect of this design is that the event timing is described as the time (index time) from the last event (delta time from the last event) that is identical to design simulation. Based upon this index time, the tester hardware generates drive events (input stimulus to the DUT), strobe events (for sampling the DUT response output), and expect events (expected value for comparison with DUT output) without any need for data translation from the VCD file 60 (FIG. 5A). This unique aspect allows any single and multiple event edit (shift, add, delete) during testing by simply using the time index value. Such event edits are not possible in the present day test systems because the test data is cyclized according to the waveform sets. The requirements of the cyclization in the conventional test systems makes it impossible for testing and debug of the designed IC in the event format.

In the event based test system of the present invention, because of this use of the time index value for each event, the memory requirement for the event test system becomes much higher than the present day test systems. However, the present invention does not require specialized timing and waveform generation circuits as mentioned earlier and shown in FIGS. 3A–3C. It should be noted that an alternative implementation would be to use absolute time (rather than the delta time) for each event. In such a situation, the absolute time is defined as a time length, for example, from a start point of operation.

The right side of FIGS. 5A illustrates an example of data structure in a VCD file 60 and an event memory 62. As mentioned above, VCD is a timed-value format, and in the middleware 58, this timed-value event data is denoted by time indices and signal value to be stored in the event memory 62 in the tester hardware 61. In the present implementation, the assignee use a 18-bits word (event data) for each event, the most significant 3-bits are used for the signal value (event type) and 15-bits are used for the time index (ex. delta time from the previous event on the same signal) Typically, the delta time for each event is accumulated when generating the test vectors.

The various combinations of 3-bits can represent up to eight possible values of the events (event types). For example, in this implementation, the assignee has used seven values, "drive 1", "drive 0", "drive Z", "compare 1", "compare 0", "compare Z", and "no-op". The "drive 1", "drive 0" and "drive Z" are drive events as stimulus for the device under test (DUT) and "compare 1", "compare 0" and "compare Z" are compare or strobe events for comparing the output of the DUT with expected values, where "Z" denotes a high-impedance value. The 15-bits value can represent delta time (time difference from the previous event) up to $2^{15}$. The same assignees have also developed more elaborate method for delay time generation and data compaction in memory as disclosed in U.S. patent applications Ser. No. 09/535,031 (now U.S. Pat. No. 6,668,331) and Ser. No. 09/545,730 (now U.S. Pat. No. 6,578,169), hence, it is not repeated here.

It should be noted that in addition to 1, 0 and Z, the IC simulation data also contains "X" (don't care value). The assignee has further developed a unique method to handle don't care values by converting X into Z (high-impedance value). Thus, all don't care values become equivalent to previous value on the signal. With this method, it is able to limit signal values to only three possibilities; namely, 1, 0, and Z and subsequently, save a lot of memory. However, it should be noted that an alternative implementation with larger memory would store the signal value X with appropriate time index similar to any other signal value.

Because of this method of representing event in signal value and time index, the user can add a strobe offset for strobe low, strobe high and strobe Z, which enables the device time to respond to the expected output states. Such operations are not possible in the conventional test systems. The user can also specify the basic testing parameters such as power supply levels and currents, input and output voltages and currents, voltage clamps and supply ramp or wait times through the host computer 51 via the graphical user interface (event viewer GUI 53).

It is worth mentioning that the use of 18-bit word (event data) is just one example of the present implementation of the assignees; any length of word can be used. For example, instead of 3-bits, any number of bits can be used to denote the signal value, and instead of 15-bits, any number of bits can be used to denote the delta time.

Figure 5B:
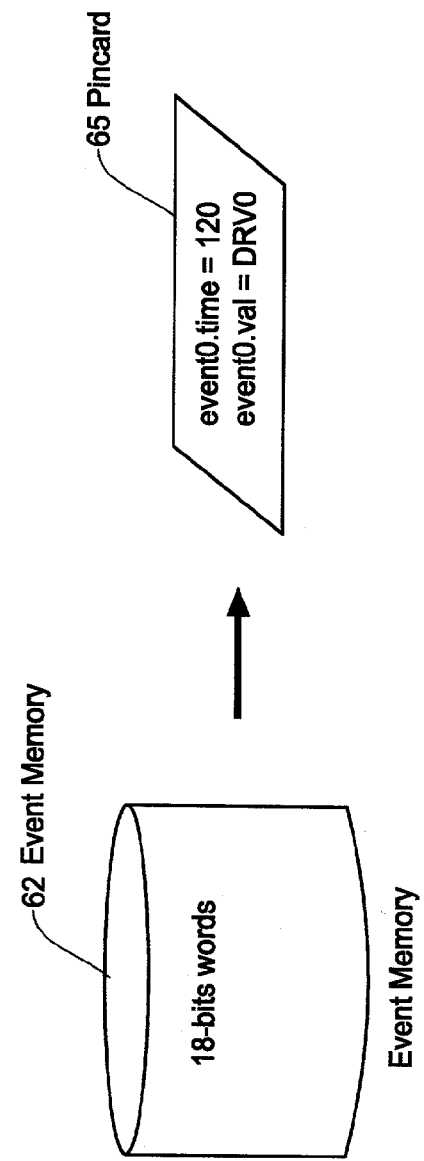

As shown in FIG. 5B, this 18-bits word (event data) from the event memory 62 is passed to a pincard 65 in the tester hardware 61 by the kernel 59 (FIG. 4). As this is a binary value, it is directly understandable by the tester hardware and accordingly, the pincard 65 can apply an appropriate drive/compare event to a specified signal at a specified time.

Similar to the event data, the middleware 58 also interprets user's commands such as run-test, move-event, add/delete-event etc., via the event viewer GUI 53 and the application server 57 and provides start/stop, setup address, power supply sequences etc. to the tester hardware 61 via the kernel 59 (or vice-versa). The necessary file structure and data flow to obtain this design is illustrated in FIG. 6A. As shown in FIG. 6A, a testplan file 63, a test parameter file 64, a pin file 65 and a socket file 66 are specified by the user through the host computer 51 and the event viewer GUI 53 of FIG. 4.

The testplan file 63 contains the type of tests to be performed such as contact test, DC/AC measurements, functional tests, etc. The parameter file 64 specifies various parameters such as Voh (voltage-out "high"), Vol (voltage-out "low"), Vil (voltage-in "low"), Vih (voltage-in "high"), Iih (current-in "high"), Iil (current-in "low"), power-supply (PS), etc. The pin file 65 specifies tester logic pin assignment given by the user. The socket file 66 specifies test socket pin assignment given by the user. Based upon the user's commands via the event viewer GUI 53, the application server 57 passes this data to the middleware 58. The middleware 58 interprets this data and based upon it, the kernel 59 appropriately switch-on or off the hardware drivers to apply this data to the device under test.

In the example of FIG. 6A, through data interpretation and processing, the middleware 58 produces various types of data, i.e, testplan 67, test 68, measurement 69, logical PIN/PS 70 and tester PIN/PS 72. Based on the data from the testplan file 63, the testplan 67 describes, for example, an order in which test should be applied, such as contact test, then AC test, and then DC test. The test 68 describes, for example, the nature of test and associated timed event values (vectors) that will be applied to the DUT, i.e, event data, timings of event data, strobe offset, etc.

The measurement 69 defines the type of measurement, such as AC or DC and associated voltage/current values based on the data from the parameter file 64. Based on the data from the pin file 65, the logic PIN/PS 70 describes the logical pin assignment with use of a pin list stored in the middleware and specifies I/O pins (input stimulus, response output) and power supply pins (Vdd, GND). Based on the data from the socket file 66 and logical PIN/PS 70, the tester PIN/PS 72 identifies physical connection between device pin and the tester channel, i.e., which I/O pin is connected to which test channel, and which Vdd/GND pin is connected to which tester channel.

In the example of FIG. 6A, for mediating between the tester hardware 61 and the middleware 58, the kernel 59 produces data, kernel FuncMeas 74 and kernel PIN/PS 76. The kernel FuncMeas 74 describes measurement voltage and current level by interpreting (mapping) the data values in the measurement 69 into actual voltages and current levels. The kernel PIN/PS 76 describes commands to activate/de-activate the specific tester channels based upon the values from the tester PIN/PS 72 so that the tester hardware acts based upon these commands.

Figure 6B:
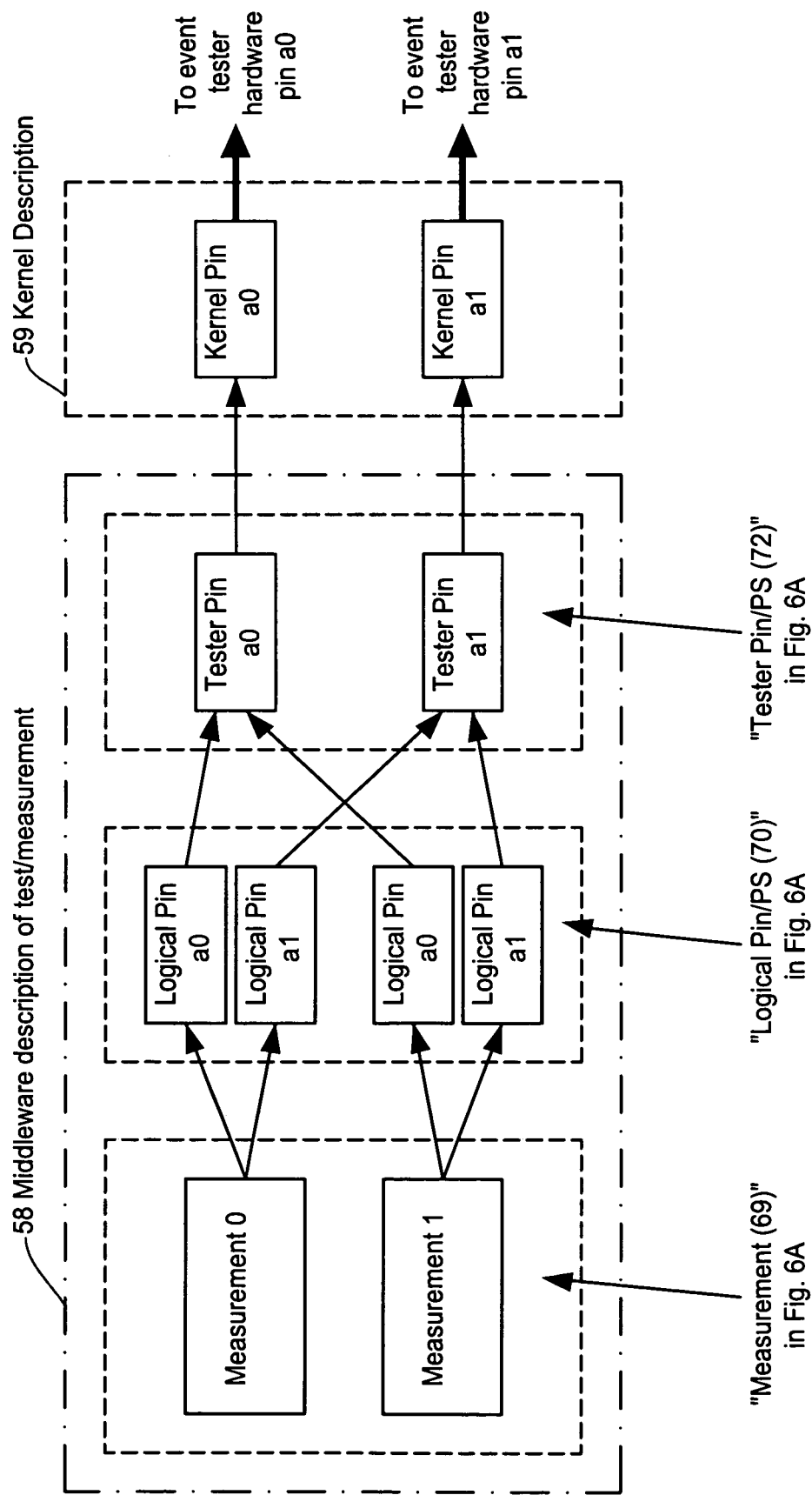
FIG. 6B is a diagram showing a file structure and data flow for mapping test/measurement pin data onto event tester hardware pins.

Using this structure and data flow, a simple example of mapping user's specified test onto physical tester hardware pins is illustrated in FIG. 6B. In FIG. 6B, a test with two measurements ("measurement 1"and "measurement 2") is shown, while each measurement is associated with two pins (a0 and a1). This example illustrates that a test may contain multiple measurements and each measurement may contain multiple pins on which specified events need to be applied and response to obtain. The mapping of pins for these two measurements follows similar to the structure as mentioned above, that is, from the GUI 53 to the middleware 58 via the application server 57 and the middleware 59 to the kernel 59 to the event tester hardware 61.

It should be noted that FIG. 6A illustrates only one file of each type for simplicity, such as one testplan file (with one test), one parameter file, one measurement and one pin-map file (for pin and power supply). In an actual test system, however, there are multiple files of each type that constitute a complete test.

Figure 7:
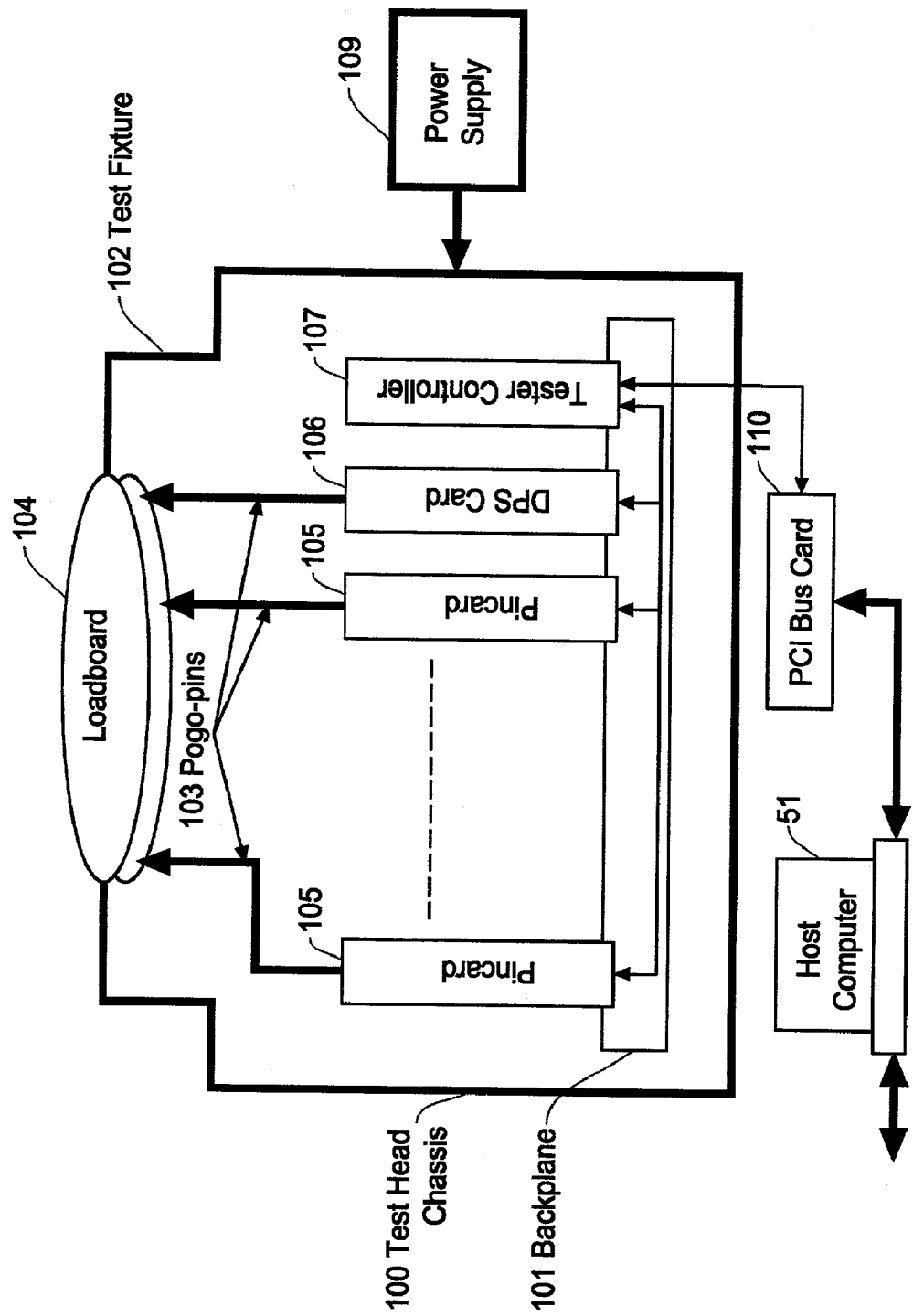
FIG. 7 is a schematic block diagram showing an overall hardware structure of the event based test system of the present invention.

After receiving the command and data, the tester hardware 61 produces the test vectors (ex. input stimulus and power supply) and applies the test vectors to the DUT. The various hardware components are illustrated in FIG. 7. The host computer 51 (that contains various software components as mentioned above) is connected to tester controller via a PCI bus card 110. In this implementation, the PCI bus is used although any other interface can also be used. A tester controller 107 resides within a test head chassis 100, that also contains a device power supply (DPS) card 106 and multiple pincards 105 and powered by a power supply 109. A backplane card 101 within the test head chassis 100 provides a simple method to connect various pincards 105, DPS card 106 and tester controller 107.

Further, through pogo-pins 103 and a test fixture (HiFix) 102 having various connectors and pins, various pincard 105 have a bi-directional access to a loadboard 104 on which DUT is placed. Thus, when a user applies a command or data, it is interpreted by the embedded software on the host computer 51 and appropriate message/data is passed to the tester controller 107 and pincards 105. The tester controller 107 and the pincards 105 apply these commands/data to DUT via the test fixture 102, pogo-pins 103 and loadboard 104 (vice-versa if user obtain data from DUT).

Figure 8:
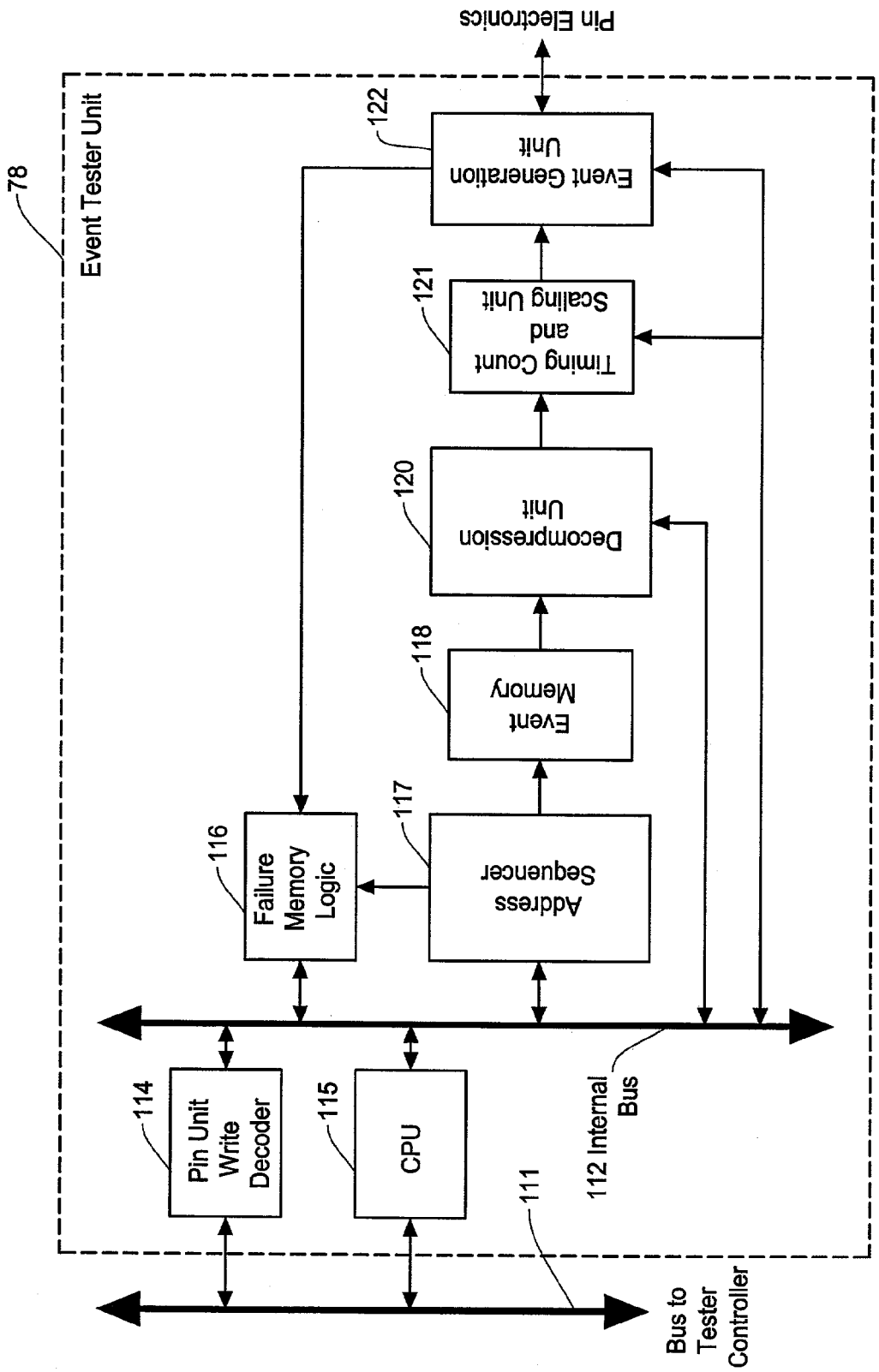
FIG. 8 is a block diagram showing a hardware structure of an event tester unit (pincard) for the event based test system of the present invention.

The block diagram of pincard 105 is illustrated in FIG. 8 where each pincard electronic circuit constitutes an event tester unit 78. Brief explanation of the event tester unit 78 is given here. The further details regarding the event tester unit is given in U.S. patent application Ser. No. 09/406,300 (now U.S. Pat. No. 6,532,561) and Ser. No. 09/259,401 (now U.S. Pat. No. 6,360,401) owned by the same assignee of this invention.

In FIG. 8, a pin unit write decoder 114 and a processor (CPU) 115 are connected to the tester controller (tester controller 107 in FIG. 7) through a system bus 111. The write decoder 114 is used, for example, for transferring data from the host computer 51 to a register (not shown) in the event tester unit 78 to assign the event tester units to pins of the device under test. In this example, the CPU 115 is provided in each event tester unit 78, and controls the operations of the event tester unit including generation of events (test vectors), evaluation of output signals from the device under test, and acquisition of failure data.

An address sequencer 117 controls the address supplied to a failure memory 116 and an event memory 118. The event timing data is transferred to the event memory 118 from the host computer 51 as a test program and stored therein. The event memory 118 stores the event data as noted above which defines an event type and timing for each event. For example, the event timing data is stored as two types of data, one of which shows integer multiples of a reference clock cycle while the other shows fractions of the reference clock cycle. Preferably, the event data is compressed before being stored in the event memory 118 for reduction of memory capacity. The event data from the event memory will be decompressed by a decompression unit 120.

Upon receiving the event data from the decompression unit 120, a timing count and scaling logic 121 produces time length data of each event by summing the event timing data of each event. By summing the event timing data showing the delta time (time length from the previous event), the resultant time length data expresses the timing of each event by a time length (delay time) from a predetermined reference point. An event generation unit 122 produces a test pattern based on the time length data and provides the test pattern to the device under test (DUT) 19 through the pin electronics (driver and comparator) and test fixture 102. Thus, a particular pin of the device under test (DUT) 19 is tested by evaluating the response output therefrom.

The major advantage of the new method allows IC testing and debug in the same environment as IC design and simulation environment. It is an architecture that uses the IC simulation VCD file directly, without the need for cyclization, test programs, vector conversion and wavesets, etc. A side-by-side comparison between the new tester architecture with the conventional test system is given in FIG. 9 where the items or processes in boxes are eliminated in the event based test system of the present invention. As listed in FIG. 9, the new system practically eliminates the entire vector processing steps and greatly simplifies file requirements and pattern compilation process. This in-turns, saves time, cost and avoid errors in the vector conversion.

Although the invention is described herein with reference to the preferred embodiment, one skilled in the art will readily appreciate that various modifications and variations may be made without departing from the spirit and scope of the present invention. Such modifications and variations are considered to be within the purview and scope of the appended claims and their equivalents.

What is claimed is:

1. A method for testing an IC device under test (DUT) designed under an automatic electronic design (EDA) environment, comprising the following steps of:

storing event data derived directly from simulation of design data for an intended IC in the EDA environment in an event memory, the event data for each event being formed with event timing data indicating a time length from a previous event and event type data indicating a type of event;

generating test vectors based on the event data from the event memory where waveform of each vector is determined by the event type data and a timing of the waveform is determined by accumulating the timing data of previous events; and supplying the test vectors to the DUT and evaluating response outputs of the DUT at predetermined timings;

wherein the event data is obtained from VCD (Value Change Dump) which are timed event values produced by executing the logic simulation without conversion or translation.

2. A method for testing an IC device under test (DUT) as defined in claim 1, further comprising a step of editing the test vectors applied to the DUT and evaluating the response output of the DUT.

3. An event based test system for testing an IC device under test (DUT) designed under an automatic electronic design (EDA) environment, comprising:

an event memory for storing event data derived directly from simulation of design data for an intended IC in the EDA environment wherein the event data to denote each event is formed with time index indicating a time length from a predetermined point and an event type indicating a type of change at an event;

an event generation unit for generating test vectors based on the event data from the event memory where waveform of each vector is determined by the event type and a timing of the waveform is determined by accumulating the time index of previous events; and means for supplying test vectors to the DUT and evaluating response outputs of the DUT at predetermined timings;

wherein the event data of each event is compressed before being stored in the event memory and wherein the time index is formed with an integer multiple of a reference clock period (integral part data) and a fraction of the reference clock period (fractional part data).

4. An event based test system as defined in claim 3, further comprising a decompression unit for reproducing the event data from the compressed event data stored in said event memory.

5. An event based test system as defined in claim 3, wherein the event data for each event is expressed by a fixed length word where a part of the word is assigned to denote the event type and another part of the word is assigned to denote the time index.

6. An event based test system as defined in claim 3, wherein the predetermined point for defining the time length in the time index is an event immediately prior to a current event so that the index time expresses a delta time between two adjacent events.

7. An event based test system as defined in claim 3, wherein the predetermined point for defining the time length in the time index is a start point of operation of the event based test system so that the index time expresses an absolute time length from the predetermined point.

8. An event based test system as defined in claim 6, wherein a value of the delta time is changed to edit the event during testing in shifting its timing, adding a new event or deleting an existing event.

9. An event based test system as defined in claim 7, wherein a value of the absolute time is changed to edit the event during testing in shifting its timing, adding a new event or deleting an existing event.

10. An event based test system as defined in claim 8, wherein a timing of strobe is offset by changing the delta time for a type of strobe specified by the event type indicated in the event data.

11. An event based test system as defined in claim 9, wherein a timing of strobe is offset by changing the absolute time for a type of strobe specified by the event type indicated in the event data.

12. An event based test system as defined in claim 5, wherein the event data derived from the simulation of design data includes an event type "don't care" in addition to 1, 0 and Z (high impedance), and wherein the "don't care" is converted to Z, thereby decreasing data describing the event type before being stored in the event memory.

13. An event based test system for testing an IC device under test (DUT) designed under an automatic electronic design (EDA) environment, comprising:
    a host computer for controlling an overall operation of the test system;
    interface software for interfacing the host computer and the event based test system, the interface software including graphic user interface (GUI) establishing an event viewer for monitoring and editing events for the test system;
    data interpretation and management software for interpreting and managing data from the host computer through the interface software; and
    event tester hardware having a plurality of event tester units for storing event data derived directly from logic simulation of design data and generating test vectors based on the event data and supplying the test vectors to the DUT and evaluating response outputs of the DUT at predetermined timings;
    wherein the data interpretation and management software includes middleware for data processing and interpretation, and kernel for mediating data values between the event tester hardware and the middleware.

14. An event based test system as defined in claim 13, wherein the interface software and the data interpretation and management software communicate directly or through a public communication network or a dedicated communication network.

15. An event based test system as defined in claim 13, wherein the middleware interprets information specified by a user and produces data including types of test, an order of tests and test parameters for supplying the data to the event tester hardware through the kernel.

16. An event based test system as defined in claim 13, wherein the middleware interprets information specified by a user and produces data including I/O pin and power supply pin of DUT in addition to types of test, order of tests and test parameters for supplying the data to the event tester hardware through the kernel.

17. An event based test system as defined in claim 13, wherein each of the event tester unit, comprising:
    a processor which controls, in response to instructions from the host computer, to generate the test vectors and to evaluate an output signal of the device under test;
    an event memory for storing the event data for each event;
    an address sequencer for providing address data to the event memory for reading the event data therefrom;
    a timing count logic for producing event timings based on the event data from the event memory; and
    an event generator for generating the test vectors based on the event timings form the timing count logic and supplying the test pattern to a corresponding pin of the DUT.

* * * * *